United States Patent
Hirota

(10) Patent No.: US 9,263,851 B2
(45) Date of Patent: Feb. 16, 2016

(54) COOLING SYSTEM, RESERVOIR UNIT AND CARTRIDGE, AS WELL AS SOLID-STATE LASER OSCILLATOR SYSTEM PROVIDED WITH THE SAME

(71) Applicant: FUJIFILM Corporation, Tokyo (JP)

(72) Inventor: Kazuhiro Hirota, Ashigarakami-gun (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 14/494,638

(22) Filed: Sep. 24, 2014

(65) Prior Publication Data

US 2015/0010030 A1    Jan. 8, 2015

Related U.S. Application Data

(63) Continuation of application No. PCT/JP2013/002009, filed on Mar. 25, 2013.

(30) Foreign Application Priority Data

Mar. 27, 2012 (JP) ................................ 2012-070512
Feb. 26, 2013 (JP) ................................ 2013-035305

(51) Int. Cl.
  *H01S 3/04* (2006.01)
  *H01S 5/024* (2006.01)
  (Continued)

(52) U.S. Cl.
  CPC ............ *H01S 5/02423* (2013.01); *F25D 17/02* (2013.01); *F28F 27/00* (2013.01);
  (Continued)

(58) Field of Classification Search
  CPC .......... H01S 3/042; H01S 3/04; H01S 3/0407; H01S 3/025; H01S 3/092; H01S 3/16

USPC ................................................ 372/35, 34, 41
See application file for complete search history.

(56) References Cited

U.S. PATENT DOCUMENTS 5,572,538 A * 11/1996 Saitoh ..................... H01S 3/042
                                                    372/34
2003/0151892 A1 * 8/2003 Kondo ..................... G06F 1/203
                                                    361/679.53

(Continued)

FOREIGN PATENT DOCUMENTS

JP    57-101730 A    6/1982
JP    62-226680 A   10/1987

(Continued)

OTHER PUBLICATIONS

Foreign Office Action of JP2013-035305 dated Mar. 17, 2015 with English translation.

(Continued)

*Primary Examiner* — Kinam Park
(74) *Attorney, Agent, or Firm* — Birch, Stewart, Kolasch & Birch, LLP

(57) ABSTRACT

A reservoir unit which is included as an element along a circulation path of a cooling system includes a cartridge and a cartridge loading unit which are configured to be removable from each other. The cartridge includes a reservoir chamber that stores a circulating liquid, and a connection portion in fluid communication with the reservoir chamber. The cartridge loading unit includes a connection receiving portion, to which the connection portion is connected, and a connection port. When the cartridge and the cartridge loading unit are attached to each other, the connection portion, the connection receiving portion and the connection port form a feed path that allows feeding the circulating liquid to the circulation path outside, and a collection path that allows collecting the circulating liquid into the reservoir chamber.

19 Claims, 10 Drawing Sheets

(51) Int. Cl.
*H01S 3/16* (2006.01)
*F25D 17/02* (2006.01)
*H01S 3/042* (2006.01)
*H05K 7/20* (2006.01)
*F28F 27/00* (2006.01)
*F28F 27/02* (2006.01)
*H01L 23/473* (2006.01)
*H01S 3/092* (2006.01)
*H01S 3/115* (2006.01)
*H01S 3/02* (2006.01)
*H01S 3/06* (2006.01)

(52) U.S. Cl.
CPC .................. *F28F 27/02* (2013.01); *H01S 3/04* (2013.01); *H01S 3/042* (2013.01); *H01S 3/0407* (2013.01); *H01S 3/16* (2013.01); *H05K 7/20254* (2013.01); *H01L 23/473* (2013.01); *H01L 2924/0002* (2013.01); *H01S 3/025* (2013.01); *H01S 3/061* (2013.01); *H01S 3/092* (2013.01); *H01S 3/115* (2013.01)

(56) References Cited

U.S. PATENT DOCUMENTS

2005/0219471 A1* 10/2005 Kitabayashi ........... G03B 21/20
 353/54
2008/0063052 A1* 3/2008 Lin ...................... H04N 19/197
 375/240.03

FOREIGN PATENT DOCUMENTS

| JP | 62-290161 A | 12/1987 |
| JP | 5-198869 A | 8/1993 |
| JP | 2002-198593 A | 7/2002 |
| JP | 2003-233442 A | 8/2003 |
| JP | 2005-292669 A | 10/2005 |

OTHER PUBLICATIONS

International Search Report, issued in PCT/JP2013/002009, dated Aug. 13, 2013.
Written Opinion of the International Searching Authority, issued in PCT/JP2013/002009, dated Aug. 13, 2013.

* cited by examiner

FIG.3
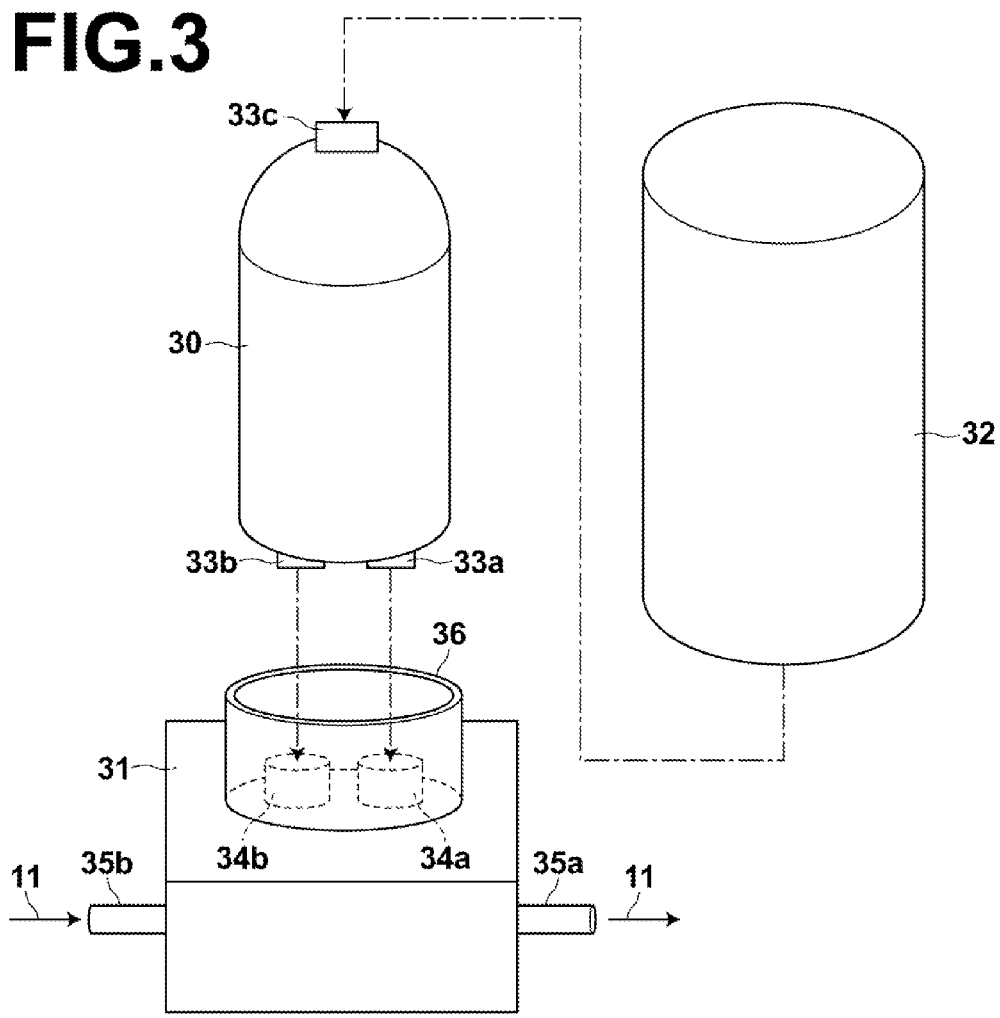
FIG.4
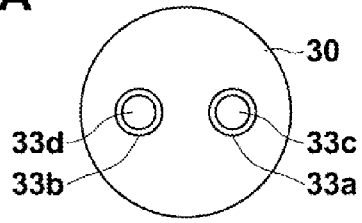
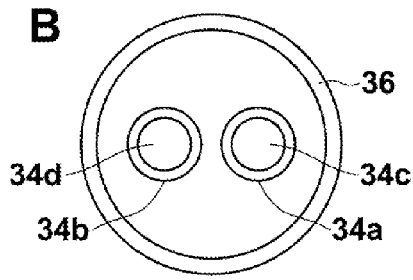

COOLING SYSTEM, RESERVOIR UNIT AND CARTRIDGE, AS WELL AS SOLID-STATE LASER OSCILLATOR SYSTEM PROVIDED WITH THE SAME

CROSS-REFERENCE TO RELATED APPLICATIONS

This application is a Continuation of PCT International Application No. PCT/JP2013/002009 filed on Mar. 25, 2013, which claims priority under 35 U.S.C. §119(a) to Japanese Patent Application No. 2012-070512 filed on Mar. 27, 2012 and Japanese Patent Application No. 2013-035305 filed on Feb. 26, 2013. Each of the above applications is hereby expressly incorporated by reference, in its entirety, into the present application.

BACKGROUND OF THE INVENTION

1. Technical Field

The present invention relates to a cooling system including a circulation path in which a coolant for cooling a heat source in a system circulates, and a reservoir unit and a cartridge used in the cooling system. The present invention also relates to a solid-state laser oscillator system provided with the cooling system.

2. Background Art

In the case of solid-state lasers, visible light or near-visible light is emitted from a flashlamp serving as an optical pumping source, and this optical energy is stored in a laser rod and converted into a laser beam. However, the energy conversion efficiency of this case is low, and most of the optical energy from the flashlamp is converted into heat. At this time, the energy efficiency in the laser rod decreases along with increase of the temperature.

In order address this problem, solid-state lasers usually include a cooling system for cooling the laser rod (see, for example, Japanese Unexamined Patent Publication No. 2002-198593 (hereinafter, Patent Document 1)). As shown in FIG. 14, for example, this type of cooling system is formed by a circulation path 85 that includes a resonator 80 (or a laser chamber) including a laser rod, which is the heat source, a heat radiator 81, a reservoir tank 82, a pump 83 and a filter 84. In the circulation path 85, a coolant fed from the reservoir tank 82 by the pump 83 passes through the filter 84, where foreign matters are removed from the coolant, and then the coolant is brought into direct contact with the laser rod in the resonator 80 to absorb heat generated at the laser rod. The heat absorbed by the coolant is radiated at the heat radiator 81, and then the coolant is returned to the reservoir tank 82. The coolant circulates in the circulation path such that the above-described steps are repeated.

The coolant is gradually contaminated due to water stain, etc., as the coolant repeatedly circulates in the circulation path, and therefore the coolant is replaced on a regular basis. Conventionally, this replacement work of the coolant is achieved by removing the coolant from the reservoir tank with a dropper, or the like, and then replenishing the reservoir tank with fresh coolant.

DISCLOSURE OF INVENTION

The above-described replacement work, however, has problems, such that the replacement work needs to be conducted by a person with expertise about the cooling system, the replacement work is troublesome, the coolant may be spilled, etc. For example, spilled coolant on a high voltage portion of the laser may cause electric leakage, and the spilled coolant itself is not desirable in view of sanitation in a medical setting, etc.

In view of the above-described circumstances, the present invention is directed to providing a cooling system and a reservoir unit which facilitate replacement work of a circulating liquid, such as a coolant, circulating in the cooling system, as well as a solid-state laser oscillator system provided with the cooling system and the reservoir unit.

In order to solve the above-described object, the cooling system according to the invention is a cooling system for cooling a heat source, the system comprising a circulation path in which a circulating liquid circulates, wherein the circulation path comprises, as elements along the path, a reservoir unit that stores the circulating liquid, a pump for feeding the circulating liquid in the circulation path, a heat absorbing section where heat generated from the heat source is absorbed by a coolant which is the circulating liquid, and a heat release section where the coolant releases heat, the reservoir unit comprises a cartridge and a cartridge loading unit configured to be removable from each other, the cartridge comprises a reservoir chamber that stores the circulating liquid, and a connection portion that includes a first communication port in fluid communication with the reservoir chamber, the cartridge loading unit comprises a connection receiving portion and a connection port, wherein the connection portion is connected to the connection receiving portion, the connection receiving portion comprises a second communication port that communicates with the first communication port when the connection portion is connected to the connection receiving portion, and the connection port provides fluid communication between the second communication port and the circulation path outside, and, when the cartridge and the cartridge loading unit are attached to each other, the connection portion, the connection receiving portion and the connection port form a feed path that allows feeding the circulating liquid in the reservoir chamber into the circulation path outside, and a collection path that allows collecting the circulating liquid from the circulation path outside into the reservoir chamber.

The "circulation path outside" as used herein refers to part of the circulation path outside the reservoir unit, that is, part of the circulation path that does not include the reservoir unit.

In the cooling system according to the invention, it is preferred that the circulation path comprise a branched valve between the reservoir unit and the pump, one of branches of the valve is connected to a gas introduction path and other two branches of the valve are connected to the circulation path, and the valve comprise valves that are openable and closable such that a path between the gas introduction path and the pump is open when the circulating liquid is collected into the reservoir chamber, or a path between the reservoir unit and the pump is open when the circulating liquid is fed from the reservoir chamber. In this case, air can be introduced as gas through the gas introduction path.

In the cooling system according to the invention, it is preferred that the reservoir chamber comprise a plurality of partitioned reservoir chambers separated from each other, the connection portion comprise a plurality of connection portions provided at the cartridge correspondingly to the individual partitioned reservoir chambers, the connection receiving portion comprise a plurality of connection receiving portions provided at the cartridge loading unit correspondingly to the individual connection portions, and the connection port be connectable to each of the second communication ports of the connection receiving portions in a switchable manner.

In this case, it is preferred that one of the partitioned reservoir chambers store a coolant as one type of the circulating liquid, and another one of the partitioned reservoir chambers store a cleaning liquid as another type of the circulating liquid.

In the cooling system according to the invention, it is preferred that at least a part of the cartridge be made of a transparent material to allow checking the level of contamination of the circulating liquid in the cartridge.

In the cooling system according to the invention, it is preferred that the reservoir unit comprise a sensor that detects whether or not the cartridge is properly attached to the cartridge loading unit, and the cooling system comprise a control unit that removes a cause of heat generation from the heat source when proper attachment between the cartridge and the cartridge loading unit is not detected by the sensor.

The reservoir unit according to the invention is a reservoir unit used as an element along a circulation path in which a circulating liquid circulates, the reservoir unit comprising a cartridge and a cartridge loading unit configured to be removable from each other, wherein the cartridge comprises a reservoir chamber that stores the circulating liquid, and a connection portion that includes a first communication port in fluid communication with the reservoir chamber, the cartridge loading unit comprises a connection receiving portion and a connection port, wherein the connection portion is connected to the connection receiving portion, the connection receiving portion comprises a second communication port that communicates with the first communication port when the connection portion is connected to the connection receiving portion, and the connection port provides fluid communication between the second communication port and the circulation path outside, and, when the cartridge and the cartridge loading unit are attached to each other, the connection portion, the connection receiving portion and the connection port form a feed path that allows feeding the circulating liquid in the reservoir chamber into the circulation path outside, and a collection path that allows collecting the circulating liquid from the circulation path outside into the reservoir chamber.

In the reservoir unit according to the invention, it is preferred that the reservoir chamber comprise a plurality of partitioned reservoir chambers separated from each other, the connection portion comprise a plurality of connection portions provided at the cartridge correspondingly to the individual partitioned reservoir chambers, the connection receiving portion comprise a plurality of connection receiving portions provided at the cartridge loading unit correspondingly to the individual connection portions, and the connection port be connectable to each of the second communication ports of the connection receiving portions in a switchable manner.

In this case, it is preferred that the reservoir unit be used in a cooling system for cooling a heat source, one of the partitioned reservoir chambers store a coolant as one type of the circulating liquid, and another one of the partitioned reservoir chambers store a cleaning liquid as another type of the circulating liquid.

In the reservoir unit according to the invention, it is preferred that at least a part of the cartridge be made of a transparent material to allow checking the level of contamination of the circulating liquid in the cartridge.

It is preferred that the reservoir unit according to the invention comprise a sensor that detects whether or not the cartridge is properly attached to the cartridge loading unit.

The cartridge according to the invention is a cartridge forming a reservoir unit used as an element along a circulation path in which a circulating liquid circulates, the cartridge being attachable to and removable from a cartridge loading unit, wherein the cartridge loading unit comprises a connection receiving portion and a connection port, the connection receiving portion comprises a second communication port in fluid communication with a first communication port of the cartridge, and the connection port provides fluid communication between the second communication port and the circulation path outside, the cartridge comprising a reservoir chamber that stores the circulating liquid, and a connection portion that includes the first communication port in fluid communication with the reservoir chamber, wherein, when the cartridge and the cartridge loading unit are attached to each other, the connection portion, the connection receiving portion and the connection port cooperate to form a feed path that allows feeding the circulating liquid in the reservoir chamber into the circulation path outside, and a collection path that allows collecting the circulating liquid from the circulation path outside into the reservoir chamber.

In the cartridge according to the invention, it is preferred that the reservoir chamber comprise a plurality of partitioned reservoir chambers separated from each other, and the connection portion comprise a plurality of connection portions provided at the cartridge correspondingly to the individual partitioned reservoir chambers.

In this case, it is preferred that the cartridge be used in a cooling system for cooling a heat source, one of the partitioned reservoir chambers store a coolant as one type of the circulating liquid, and another one of the partitioned reservoir chambers store a cleaning liquid as another type of the circulating liquid.

In the cartridge according to the invention, it is preferred that at least a part of the cartridge be made of a transparent material to allow checking the level of contamination of the circulating liquid in the cartridge.

It is preferred that the cartridge according to the invention comprise a filter for filtering out contamination from a coolant, the filter being disposed in the reservoir chamber. In this case, it is preferred that the filter comprise a hollow fiber membrane filter.

The solid-state laser oscillator system according to the invention comprises: the above-described cooling system; a laser rod; a pumping lamp for optically pumping the laser rod; and a laser chamber that contains the laser rod and the pumping lamp, wherein the laser chamber forms a part of the circulation path and serves as a heat absorbing section of the cooling system.

According to the cooling system, the reservoir unit and the cartridge according to the invention, as well as the solid-state laser oscillator system provided with them, the cartridge-type tank is used to store the circulating liquid, such as a coolant, and collection and replacement of the circulating liquid fed to the circulation path can be achieved only by removing and attaching the cartridge from and to the cartridge loading unit. This facilitates the replacement work of the circulating liquid with the cooling system in which the circulating liquid is circulated.

BRIEF DESCRIPTION OF THE DRAWINGS

FIG. 3 is a schematic perspective view illustrating the structure of a reservoir unit, FIG. 4 includes schematic views showing, at A), the structure of a cartridge of the first embodiment viewed from below, and showing, at B), the structure of a cartridge loading unit of the first embodiment viewed from above.

DESCRIPTION OF PREFERRED EMBODIMENTS

Figure 1:
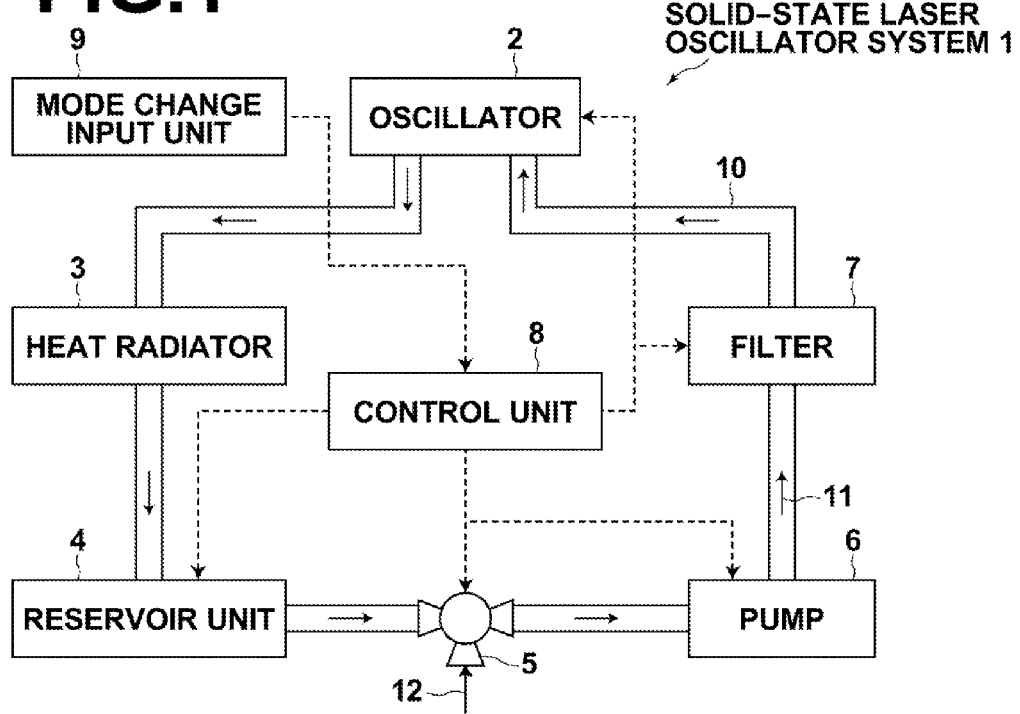
FIG. 1 is a schematic block diagram illustrating the configuration of a cooling system of a first embodiment.

Hereinafter, embodiments of the present invention will be described with reference to the drawings, which are not intended to limit the invention. For ease of visual recognition, each element shown in the drawings is not to scale.

First Embodiment

Figure 2:
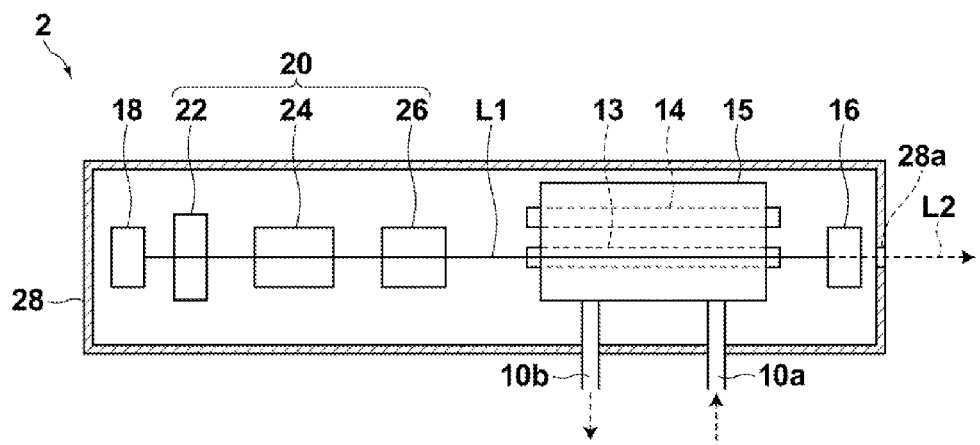
FIG. 2 is a schematic sectional view illustrating the configuration of an oscillator of a solid-state laser oscillator system.

Now, a first embodiment of a cooling system and a reservoir unit, as well as a solid-state laser oscillator system including them is described. FIG. 1 is a schematic block diagram illustrating the configuration of a cooling system of this embodiment, and FIG. 2 is a schematic sectional view illustrating the configuration of an oscillator 2 of a solid-state laser oscillator system 1. Further, FIG. 3 is a schematic perspective view illustrating the structure of a reservoir unit 4 of this embodiment.

As shown in FIG. 1, the solid-state laser oscillator system 1 of this embodiment includes: an oscillator 2 that emits laser light; a circulation path 10 including the oscillator 2 serving as a heat absorbing section of the invention, and including a heat radiator (radiator) 3 forming a heat release section of the invention, a reservoir unit 4, a valve 5, a pump 6 and a filter 7 in this order as elements along the path; a control unit 8 that controls the entire system; and a mode change input unit 9.

The cooling system of this embodiment is formed by the circulation path 10, which includes the reservoir unit 4, the valve 5, the pump 6, the filter 7, the oscillator 2 and the heat radiator 3 in this order as elements along the path, and the control unit 8 that controls the entire system. That is, the cooling system of this embodiment is applied as a system for cooling a heat source, i.e., the laser rod, in the solid-state laser oscillator system 1. It should be noted that a coolant as a circulating liquid in the circulation path 10 circulates in the direction indicated by the arrows 11, for example.

Oscillator

The configuration of the oscillator 2 is not particularly limited. For example, as shown in FIG. 2, the oscillator 2 includes a laser rod 13, a pumping lamp 14, a laser chamber 15, an output mirror 16, a total reflection mirror 18, a Q-switch 20, and a housing 28 that houses these elements. The oscillator 2 (in particular, the laser chamber 15 in the oscillator 2) corresponds to the heat absorbing section of the invention.

The laser rod 13 is a solid element including an active solid medium, such as a YAG rod made of a yttrium aluminum garnet (YAG: $Y_3Al_5O_{12}$) crystal doped with $Nd^{3-}$, which is an active medium. The laser rod 13 has a rod-like shape, for example. The laser rod 13 functions as a laser medium that receives optical energy from the pumping lamp 14 and amplifies light of a specific wavelength. Light L1 emitted from the laser rod 13 by stimulated emission is amplified by resonation in a resonator formed by the output mirror 16 and the total reflection mirror 18, and then is outputted as laser L2 (FIG. 2). It should be noted that the laser rod 13 may preferably be made of alexandrite.

The pumping lamp 14 is a light source for supplying energy for causing the stimulated emission from the laser rod 13. As the pumping lamp 14, a rod-shaped flashlamp charged with Xe gas, for example, may be used. The pumping lamp 14 is connected to a power supply (not shown) located outside the housing 28.

The laser chamber 15 is a member that contains the laser rod 13 and the pumping lamp 14 and collects light emitted from the pumping lamp 14 onto the laser rod 13. The laser chamber 15 has a hollow cylindrical shape extending in the length direction of the laser rod 13 and the pumping lamp 14, for example. The laser chamber 15 forms a part of the circulation path 10 of the cooling system, and is configured such that the coolant flowing in through tubing 10a flows inside the laser chamber 15 and then flows out through tubing 10b. At this time, the coolant is brought into direct contact with the laser rod 13 to achieve heat exchange, thereby absorbing heat from the laser rod 13.

The Q-switch 20 is located in the optical axis of the light L1 emitted by the stimulated emission and between the laser rod 13 and the total reflection mirror 18. The Q-switch 20 is formed by a λ/4 plate 22, a Pockels cell 24 and a polarizer 26, for example.

The housing 28 is formed to have a cuboid shape, for example, and includes an aperture 28a for outputting the laser L2 formed in the side wall facing the output mirror 16.

Heat Radiator

The heat radiator 3 is a so-called radiator and corresponds to the heat release section of the invention. The structure of the heat radiator 3 is not particularly limited, and a commonly-used radiator can be used. For example, meandering tubing with a heat sink in contact therewith may be used as the heat radiator 3. In order to enhance the heat radiation effect, it is preferred to use a fan in combination.

Reservoir Unit

The reservoir unit 4 is a cartridge-type reservoir tank for the coolant. As shown in FIG. 3, the reservoir unit 4 of this embodiment includes: a cartridge 30 that stores the coolant; a cartridge loading unit 31 to which the cartridge 30 is attached; and a cover 32 that covers the attached cartridge 30.

Figure 5A:
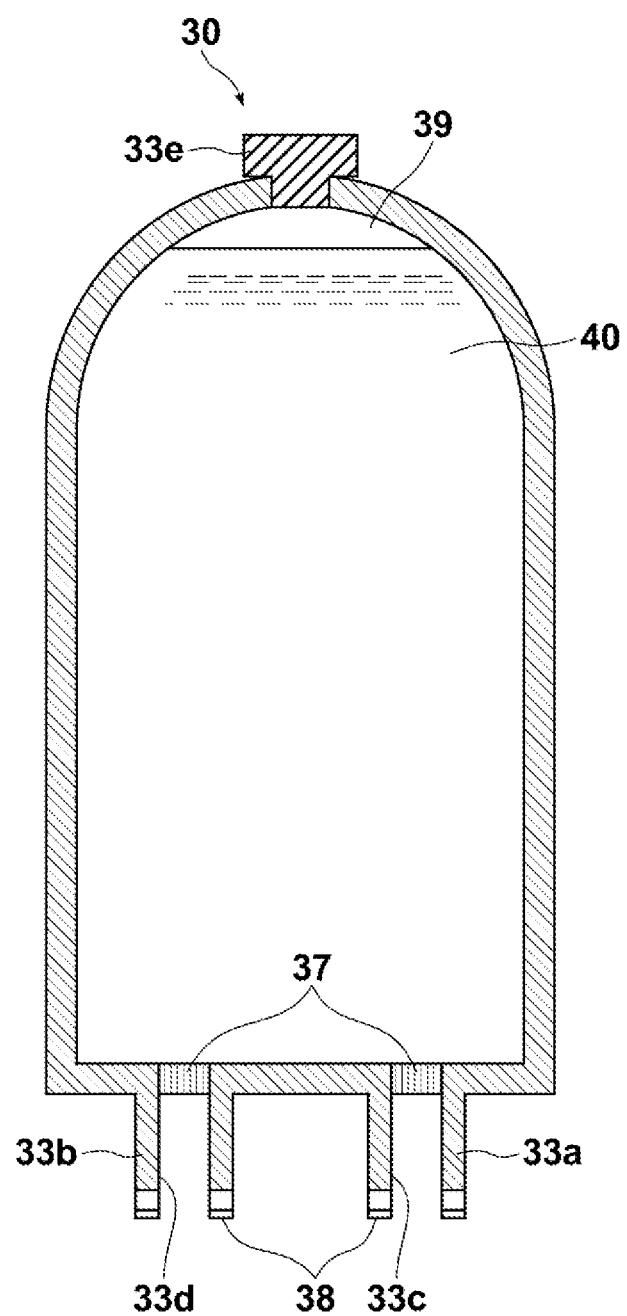
FIG. 5A is a schematic view showing a cross-section of the cartridge.

As shown in FIG. 3, at A in FIG. 4 and in FIG. 5A, the cartridge 30 has a hollow cylindrical shape with a top portion having a gradually decreasing diameter, for example, and includes a reservoir chamber (coolant chamber 39) for storing the coolant 40 therein. The cartridge 30 also includes, at the bottom surface thereof, connection portions 33a and 33b that allow connection to the cartridge loading unit 31. The connection portions 33a and 33b include communication ports 33c and 33d, respectively, for connecting the outside of the cartridge to the coolant chamber 39 to provide fluid communication therebetween, that is, to allow the circulating liquid to flow therebetween. The communication ports 33c and 33d correspond to a first communication port of the invention. For example, the connection portion 33a allows feeding the coolant 40 from the cartridge 30 to the cartridge loading unit 31 through the communication port 33c, and the connection portion 33b allows feeding the coolant 40 from the cartridge loading unit 31 to the cartridge 30 through the communication port 33d. It should be noted that, although the case where each independent connection portion has one communication port is described in this embodiment, each independent connection portion of the invention may have a plurality of communication ports in a state where the coolant feeding function and the coolant collecting function are separated from each other. Each of the connection portion 33a and the connection portion 33b is provided with a cartridge valve 37 for preventing leakage of the coolant 40 contained in the cartridge before the cartridge 30 is attached to the cartridge loading unit 31. The cartridge valves 37 are opened when the connection portion 33a and the connection portion 33b are properly connected to the connection receiving portion 34a and the connection receiving portion 34b, respectively, of the cartridge loading unit 31. It is preferred that each of the connection portion 33a and the connection portion 33b be provided with an O-ring 38, so that no gap is formed when the cartridge 30 is properly attached to the cartridge loading unit 31 (FIG. 5A).

Figure 5B:
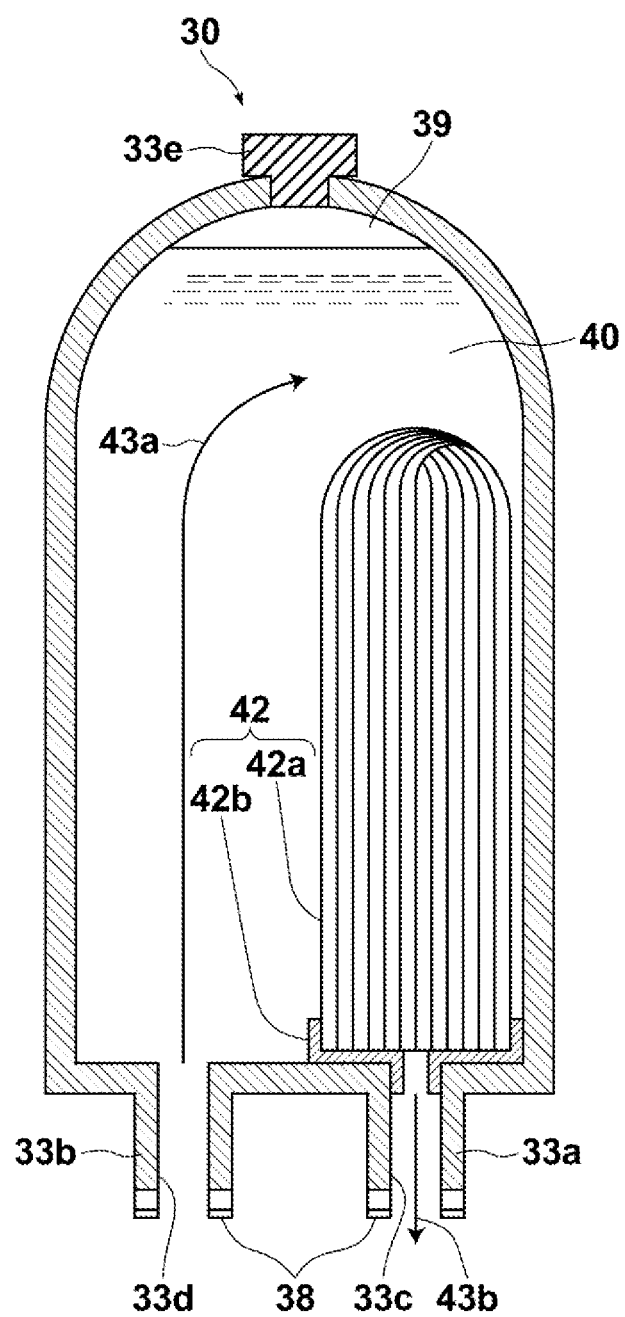
FIG. 5B is a schematic view showing a cross-section of the cartridge including a hollow fiber membrane module.

Further, as shown in FIG. 5B, it is preferred that the cartridge 30 include therein a hollow fiber membrane module 42 for filtering out contamination from the coolant. For example, the hollow fiber membrane module 42 shown in FIG. 5B is formed by a bundle of folded hollow fiber membranes 42a and a holding case 42b that holds ends of the hollow fiber membranes 42a. The holding case 42b has a hole connecting to the communication port 33c. Thus, the coolant 43a flowing in through the communication port 33d first enters the hollow fiber membranes 42a, and the coolant 43b filtered through the hollow fiber membranes 42a can flow out to the communication port 33c through the hole. Providing the hollow fiber membrane module 42 in the cartridge 30, which forms a part of the circulation path of the coolant, in this manner allows filtering out contamination from the coolant and replacing the cartridge 30 and the hollow fiber membrane module at a time. It should be noted that, in the case where the cartridge 30 includes the above-described hollow fiber membrane module 42, the filter 7 may not be provided.

The cartridge 30 includes, at a top portion thereof, for example, a replenishment section 33e for replenishing the coolant 40. Replenishment of the coolant 40 is allowed by opening the cap of the replenishment section 33e. Further, a filter (not shown) that permeates gas and does not permeate liquid is provided at a part of the cap to allow airflow into and out of the cartridge 30. Further, it is preferred that at least a part of the cartridge 30 be made of a transparent material (for example, a resin, such as an acrylic resin) to allow checking the level of contamination of the coolant 40 in the cartridge 30. In this case, one can visually tell if it is time to replace the coolant 40.

Figure 6:
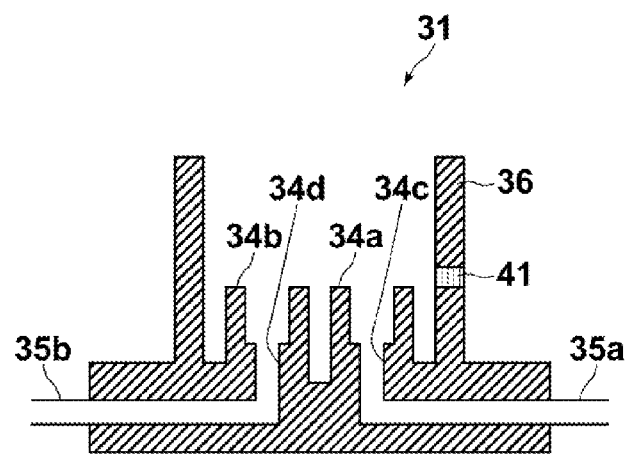
FIG. 6 is a schematic view showing a cross-section of a cartridge loading unit.

As shown in FIG. 3, at B in FIG. 4, and in FIG. 6, the cartridge loading unit 31 includes a guide portion 36 having a shape (in this embodiment, a hollow cylindrical shape) that conform to the shape of the cartridge 30, for example, to guide the attachment of the cartridge 30. Further, the cartridge loading unit 31 includes, in the guide portion 36, a connection receiving portion 34a connectable to the connection portion 33a and a connection receiving portion 34b connectable to the connection portion 33b. The connection receiving portions 34a and 34b include communication ports 34c and 34d, respectively. The communication ports 34c and 34d correspond to a second communication port of the invention. When the connection portion 33a is connected to the connection receiving portion 34a, fluid communication between the communication ports 33c and 34c is provided, and when the connection portion 33b is connected to the connection receiving portion 34b, fluid communication between the communication ports 33d and 34d is provided. It should be noted that, although the case where each independent connection receiving portion has one communication port is described in this embodiment, each independent connection receiving portion may have a plurality of communication ports in a state where the coolant feeding function and the coolant collecting function are separated from each other correspondingly to the connection portions.

Figure 7:
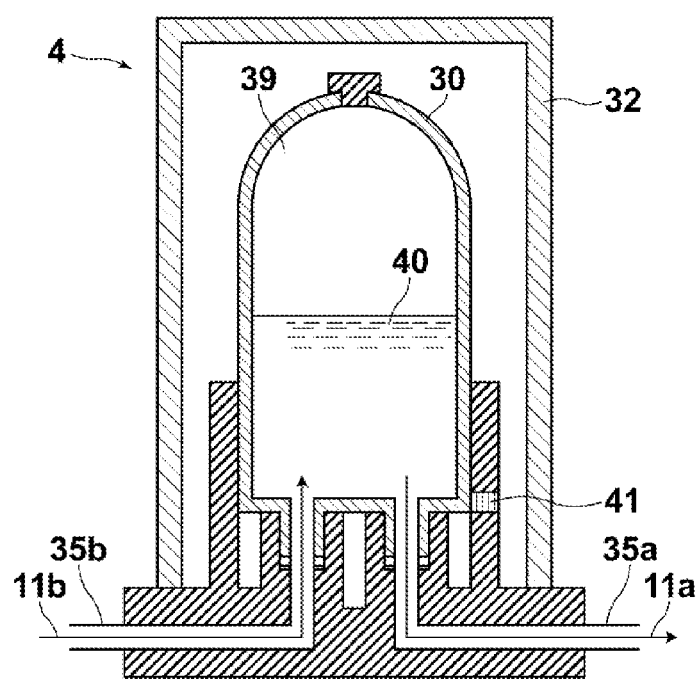
FIG. 7 is a schematic view showing a cross-section of a reservoir unit with the cartridge attached to the cartridge loading unit.

Further, the cartridge loading unit 31 includes an outlet port 35a and an inlet port 35b for connecting the cartridge 30 to the circulation path outside. Each of the outlet port 35a and the inlet port 35b corresponds to a connection port of the invention. Specifically, the outlet port 35a provides fluid communication between the communication port 34c and the circulation path outside, and the inlet port 35b provides fluid communication between the communication port 34d and the circulation path outside. Thus, when the cartridge 30 is attached to the cartridge loading unit 31, as shown in FIG. 7, the coolant chamber 39 in the cartridge 30 is connected to the outlet port 35a via the connection portion 33a and the connection receiving portion 34a, and connected to the inlet port 35b via the connection portion 33b and the connection receiving portion 34b. That is, the connection portion 33a, the connection receiving portion 34a and the outlet port 35a form a feed path 11a that allows feeding the coolant in the coolant chamber 39 to the circulation path outside, and the connection portion 33b, the connection receiving portion 34b and the inlet port 35b form a collection path 11b that allows collecting the coolant from the circulation path outside into the coolant chamber 39. In this state, the circulation path in the reservoir unit 4 is open and the coolant 40 in the cartridge 30 can circulate as the circulating liquid in the circulation path 10.

It is preferred that the cartridge loading unit 31 include a sensor for detecting whether or not the cartridge 30 is properly attached to the cartridge loading unit 31. In this embodiment, the cartridge loading unit 31 includes a sensor 41 located at a part of the guide portion 36 that is in contact with the side surface of the cartridge 30 when the cartridge 30 is properly attached to the cartridge loading unit 31. By providing such a sensor, inappropriate attachment between the cartridge 30 and the cartridge loading unit 31 can be prevented, and a cause of heat generation from the heat source can be removed in a state where the cooling system is not normal based on the presence or absence of a detection signal from the sensor 41. Specifically, in this embodiment where the system including the heat source is the solid-state laser oscillator system, if there is no detection signal from the sensor 41, a measure, such as inhibiting turning on the flashlamp in the state where the cooling system is not normal, or displaying a warning to the effect that the cooling system is not normal on the solid-state laser oscillator system, may be taken. For example, in this embodiment, a detection signal from the sensor is outputted to the control unit 8. The sensor 41 is not particularly limited, and any of known sensors, such as a microswitch, a magnetic sensor, an optical sensor, etc., may be used.

The cover 32 prevents deposition of dusts, etc., on the cartridge 30 and the cartridge loading unit 31, and protects the cartridge 30 and the cartridge loading unit 31 from external impact. The cover 32 is therefore not essential in the invention.

Valve

The valve 5 has at least three branches, where one of the branches is connected to the gas introduction path 12, and other two of the branches are connected to the circulation path 10. As the valve 5, an electromagnetic valve may be used, for example. Opening and closing of the valve may be controlled manually; however, in this embodiment, opening and closing of the valves of the valve 5 is controlled by the control unit 8. Further, the valve 5 includes, for example, valves that can be switched between a state where only the path between the gas introduction path 12 and the pump 6 is open (a first open state) and a state where only the path between the reservoir unit 4 and the pump 6 is open (a second open state). Then, when the valves are in the first open state, gas is introduced into the circulation path 10 from the gas introduction path 12, and the coolant 40 in the circulation path 10 is pushed out by the gas and is collected into the cartridge 30. It should be noted that, at this time, gas in the cartridge 30 escapes through the previously described filter portion of the cap. On the other hand, when the valves are in the second open state after the coolant 40 is collected into the cartridge 30 or a new cartridge 30 is attached, for example, feeding of the coolant 40 in the cartridge 30 is driven by the pump 6 and the coolant 40 in the cartridge 30 is fed to the circulation path outside to fill the circulation path 10 with the coolant 40. At this time, gas in the circulation path 10 is trapped in the cartridge 30 and is collected in the cartridge 30 as a result. The position of the valve 5 is preferably downstream and near the reservoir unit 4 in order to collect more amount of the coolant 40.

In this embodiment, the state of opening and closing of the valves of the valve 5 is controlled using the above-described principle, thereby achieving collection and replacement of the coolant 40. The gas introduction path 12 may introduce air as the gas. When air is introduced, the gas introduction path 12 may be open to the atmosphere. Alternatively, the gas introduction path 12 may be connected to a tank containing dry air, nitrogen, or the like.

It should be noted that the manner of feeding the gas is not limited to one using the valve 5 as described above. For example, air at the upper portion of the cartridge 30 is fed into the circulation path 10 by rotating the pump 6 in the opposite direction to make the coolant 40 flow in the circulation path 10 in the opposite direction. In this case, the valve 5 is not necessary.

Pump

The pump 6 feeds the coolant 40 in the circulation path 10. The pump 6 is not particularly limited, and a common water pump can be used. It should be noted that the position of the pump is not limited the position in this embodiment.

Filter

The filter 7 filters the coolant 40 in the circulation path 10 to remove contamination from the coolant 40. Thus, the clean coolant can be fed to the laser chamber 15, thereby reducing contamination of the laser rod 13. It should be noted that the filter is not essential in the invention.

Control Unit

The control unit 8 controls the entire solid-state laser oscillator system 1 and the cooling system, and is implemented by an information processing unit, such as a computer. For example, the control unit 8 controls the solid-state laser oscillator system 1 such that use of the flashlamp 14 in the oscillator 2 is inhibited based on a detection signal from the sensor 41 of the cartridge loading unit 31. For example, if a signal to the effect that the cooling system is not normal is received, the control unit 8 exerts control such that the power supply to the flashlamp is not turned on. In this embodiment, the control unit 8 also controls opening and closing of the valve 5. In addition, the control unit 8 may control the direction of rotation of the pump 6, and/or monitor the level of contamination of the filter 7.

Mode Change Input Unit

The mode change input unit 9 allows the operator who performs the replacement work of the coolant 40 to select the boot mode of the cooling system, such as a coolant collecting mode, a coolant circulating mode, a cleaning mode, etc. Information of the selected mode is sent from the mode change input unit 9 to the control unit 8, and the control unit 8 exerts necessary control to the valve 5, the pump 6, etc., based on the information.

Procedure of Replacement Work

Figure 8:
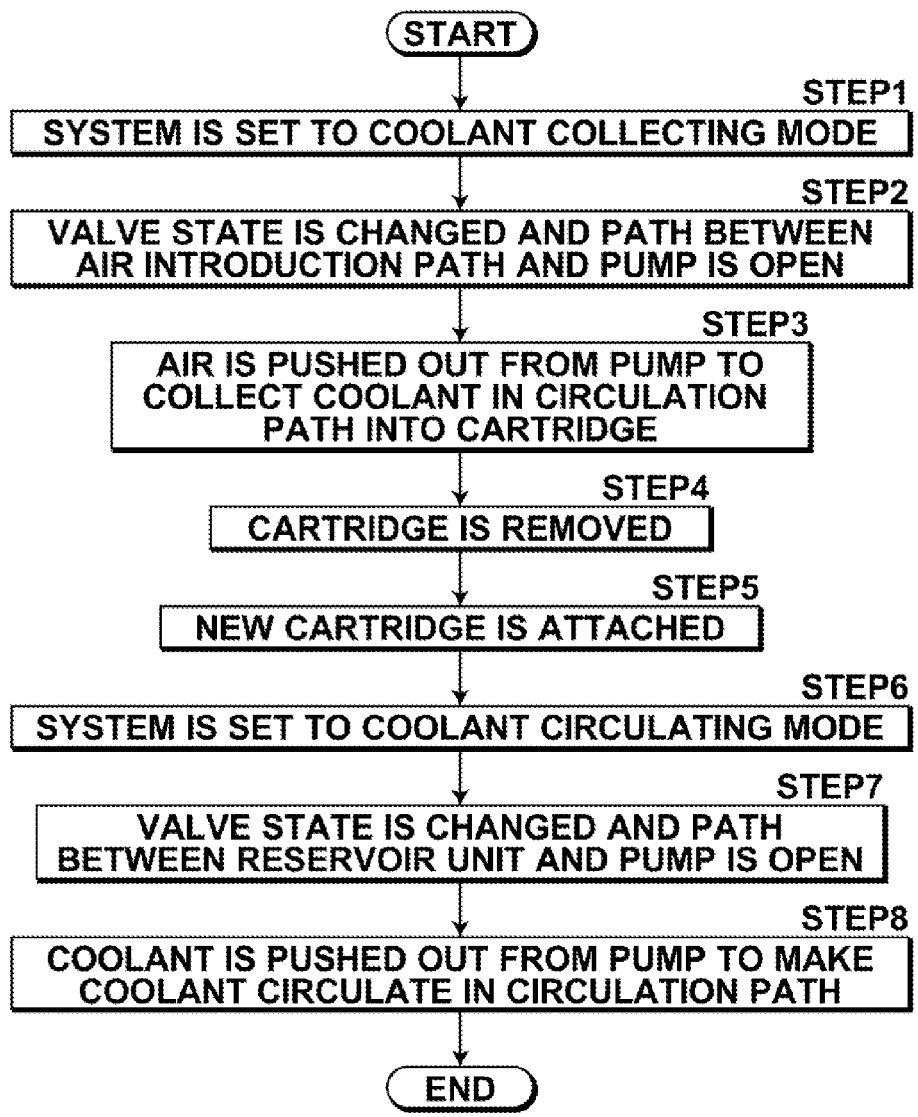
FIG. 8 is a flow chart showing steps of a coolant replacement work of the first embodiment, FIG. 9 includes schematic views showing, at A), the structure of a cartridge of the second embodiment viewed from below, and showing, at B), the structure of a cartridge loading unit of the second embodiment viewed from above.

Now, the procedure of the coolant replacement work of this embodiment is described using FIG. 8. FIG. 8 is a flow chart showing the steps of the coolant replacement work of this embodiment.

In order to replace the coolant 40 circulating in the circulation path 10, it is first necessary to collect the circulating coolant 40 into an empty cartridge 30. To this end, the operator sets the mode of the cooling system to the coolant collecting mode via the mode change input unit 9 (STEP 1). At this time, the control unit 8 changes the valve state of the valve 5 from the second open state to the first open state (STEP 2). Thus, the path between the gas introduction path 12 and the pump 6 is open, and gas is introduced from the gas introduction path 12 into the circulation path 10 to push the coolant 40 out into the coolant chamber 39 of the cartridge 30, thereby collecting the coolant 40 into the cartridge 30 (STEP 3). It should be noted that, when all the coolant 40 has been collected, the circulation path outside is filled with gas. Thereafter, the current cartridge 30 is removed (STEP 4), and a new cartridge 30 containing fresh coolant 40 is attached to the cartridge loading unit 31 (STEP 5). After the cartridge 30 is properly attached to the cartridge loading unit 31, the mode of the cooling system is manually or automatically changed to the coolant circulating mode (STEP 6). At this time, the control unit 8 changes the valve state of the valve 5 from the first open state to the second open state (STEP 7). Thus, the path between the reservoir unit 4 and the pump 6 is open, and the coolant 40 is fed from the cartridge 30 into the circulation path outside and begins to circulate as the circulating liquid in the circulation path 10 (STEP 8). When the circulation path 10 is filled with the coolant 40, the replacement work of the coolant 40 ends.

As described above, according to the cooling system, the reservoir unit and the cartridge of this embodiment, as well as the solid-state laser oscillator system provided with them, the cartridge-type tank is used to store the coolant, and collection and replacement of the coolant can be achieved only by removing and attaching the cartridge from and to the cartridge loading unit. This facilitates the coolant replacement work for the cooling system in which the coolant is circulated.

Modifications

Although the case where the cartridge 30 only includes the coolant chamber 39 is described in the first embodiment, this is not intended to limit the invention. An aspect where the cartridge includes therein a plurality of partitioned reservoir chambers may be adopted. In this case, the cartridge includes a plurality of connection portions for providing connection to the cartridge loading unit correspondingly to the individual partitioned reservoir chambers of the cartridge, and the cartridge loading unit also includes a plurality of connection receiving portions correspondingly to the number of the connection portions. In the case where the reservoir chamber includes a plurality of partitioned reservoir chambers, the partitioned reservoir chambers may store different types of circulating liquids or the same type of circulating liquid. For example, in the case where the partitioned reservoir chambers store a coolant as the same type of circulating liquid, replacement of the coolant can be achieved only by changing the reservoir chamber connected to the outlet port and the inlet port, without preparing a new cartridge.

In the case where the reservoir chamber includes a plurality of partitioned reservoir chambers, each of the outlet port and the inlet port is connectable to any one of the communication ports in the connection receiving portions provided correspondingly to the number of the partitioned reservoir chambers in the state where the cartridge is attached to the cartridge loading unit. In this case, however, in a given attachment state of the cartridge and the cartridge loading unit, it is not necessary that the outlet port and the inlet port are connectable to all the partitioned reservoir chambers. That is, there may be a partitioned reservoir chamber that is not connectable to the outlet port and the inlet port in a certain attachment state, and is connectable to the outlet port and the inlet port in another attachment state where the relative positional relationship between the cartridge and the cartridge loading unit is changed from the previous attachment state. The change of the relative positional relationship may include, for example, rotating the cartridge or inverting the cartridge upside down. The outlet port and the inlet port are connected to one of the partitioned reservoir chambers that contains a desired circulating liquid to be fed into the circulation path in each case.

Second Embodiment

Next, a second embodiment of the cooling system, the reservoir unit and the cartridge, as well as the solid-state laser oscillator system provided with them is described. The difference between this embodiment and the first embodiment lies in the structures of the cartridge and the cartridge loading unit. Therefore the same features as those of the first embodiment are not described in detail unless otherwise necessary. It should be noted that the similar elements are denoted by the same reference numerals as long as there is no inconvenience.

Figure 9:
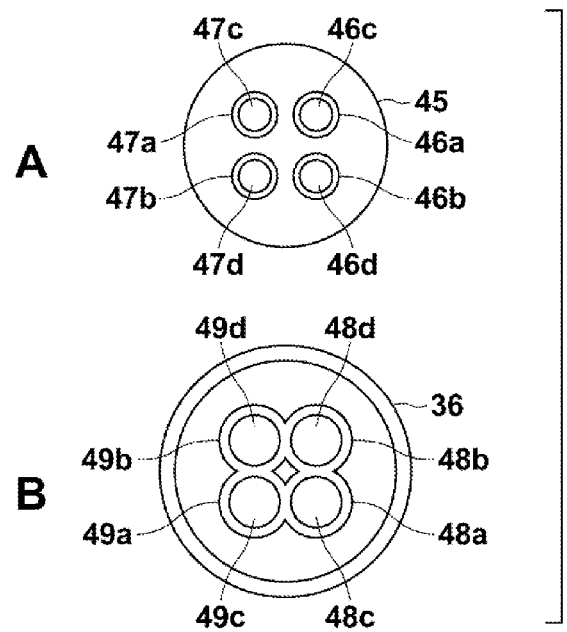
Figure 10:
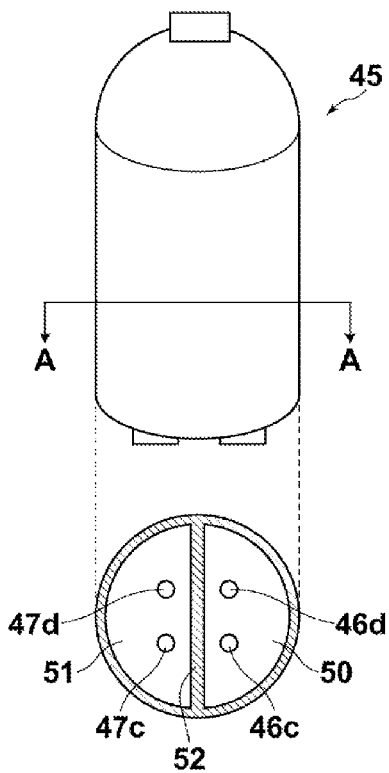
FIG. 10 is a schematic view showing the cross-section of a reservoir chamber of the cartridge of the second embodiment taken along the line A-A.

FIG. 9 is a schematic view showing, at A, the structure of a cartridge 45 of this embodiment viewed from below, and showing, at B, the structure of a cartridge loading unit of this embodiment viewed from above. FIG. 10 is a schematic view showing a cross-section taken along the line A-A of reservoir chambers of the cartridge 45 of this embodiment.

Similarly to the first embodiment, the solid-state laser oscillator system 1 of this embodiment includes: the oscillator 2 that emits laser light; the circulation path 10 including the oscillator 2 serving as the heat absorbing section, the heat radiator 3, the reservoir unit 4, the valve 5, the pump 6 and the filter 7 in this order as elements along the path; the control unit 8 that controls the entire system; and the mode change input unit 9.

Then, similarly to the first embodiment, the cooling system of this embodiment is formed by the circulation path 10, which includes the reservoir unit 4, the valve 5, the pump 6, the filter 7, the oscillator 2 and the heat radiator 3 in this order as elements along the path, and the control unit 8 that controls the entire system.

Reservoir Unit

As shown in FIGS. 9 and 10, the cartridge 45 of this embodiment has two partitioned reservoir chambers including a coolant chamber 50 for storing a coolant and a cleaning liquid chamber 51 for storing a cleaning liquid. The coolant chamber 50 and the cleaning liquid chamber 51 are separated from each other by a partition 52. Further, the cartridge 45 includes connection portions 46a, 46b, 47a and 47b that allow connection to the cartridge loading unit. The connection portions 46a and 46b include communication ports 46c and 46d, respectively, for providing fluid communication between the outside of the cartridge and the coolant chamber 50. The connection portions 47a and 47b include communication ports 47c and 47d, respectively, for providing fluid communication between the outside of the cartridge and the cleaning liquid chamber 51. For example, the connection portion 46a allows feeding the coolant from the coolant chamber 50 to the cartridge loading unit via the communication port 46c, and the connection portion 46b allows feeding the coolant from the cartridge loading unit to the coolant chamber 50 via the communication port 46d. On the other hand, the connection portion 47a allows feeding the cleaning liquid from the cleaning liquid chamber 51 to the cartridge loading unit via the communication port 47c, and the connection portion 47b allows feeding the cleaning liquid from the cartridge loading unit to the cleaning liquid chamber 51 via the communication port 47d.

The cartridge loading unit includes, in the guide portion 36, a connection receiving portion 48a connectable to the connection portion 46a, a connection receiving portion 48b connectable to the connection portion 46b, a connection receiving portion 49a connectable to the connection portion 47a, and a connection receiving portion 49b connectable to the connection portion 47b. In this embodiment, the outlet port and the inlet port are connectable to the coolant chamber 50 or the cleaning liquid chamber 51 in a switchable manner. That is, there are two types of connection modes of the outlet port and the inlet port of this embodiment including a connection mode where the coolant chamber 50 is connected to the outlet port via the connection portion 46a and the connection receiving portion 48a and is connected to the inlet port via the connection portion 46b and the connection receiving portion 48b, and a connection mode where the cleaning liquid chamber 51 is connected to the outlet port via the connection portion 47a and the connection receiving portion 49a and is connected to the inlet port via the connection portion 47b and the connection receiving portion 49b. Switching between the connection modes of the outlet port can be achieved, for example, by providing the outlet port with branch paths respectively connected to the communication port 48c of the connection receiving portion 48a which provides fluid communication with the coolant chamber 50 and to the communication port 49c of the connection receiving portion 49a which provides fluid communication with the cleaning liquid chamber 51, and using shutters to achieve switching between the branch paths. Switching between the connection modes of the inlet port can also be achieved in the similar manner.

Procedure of Replacement Work

Figure 11:
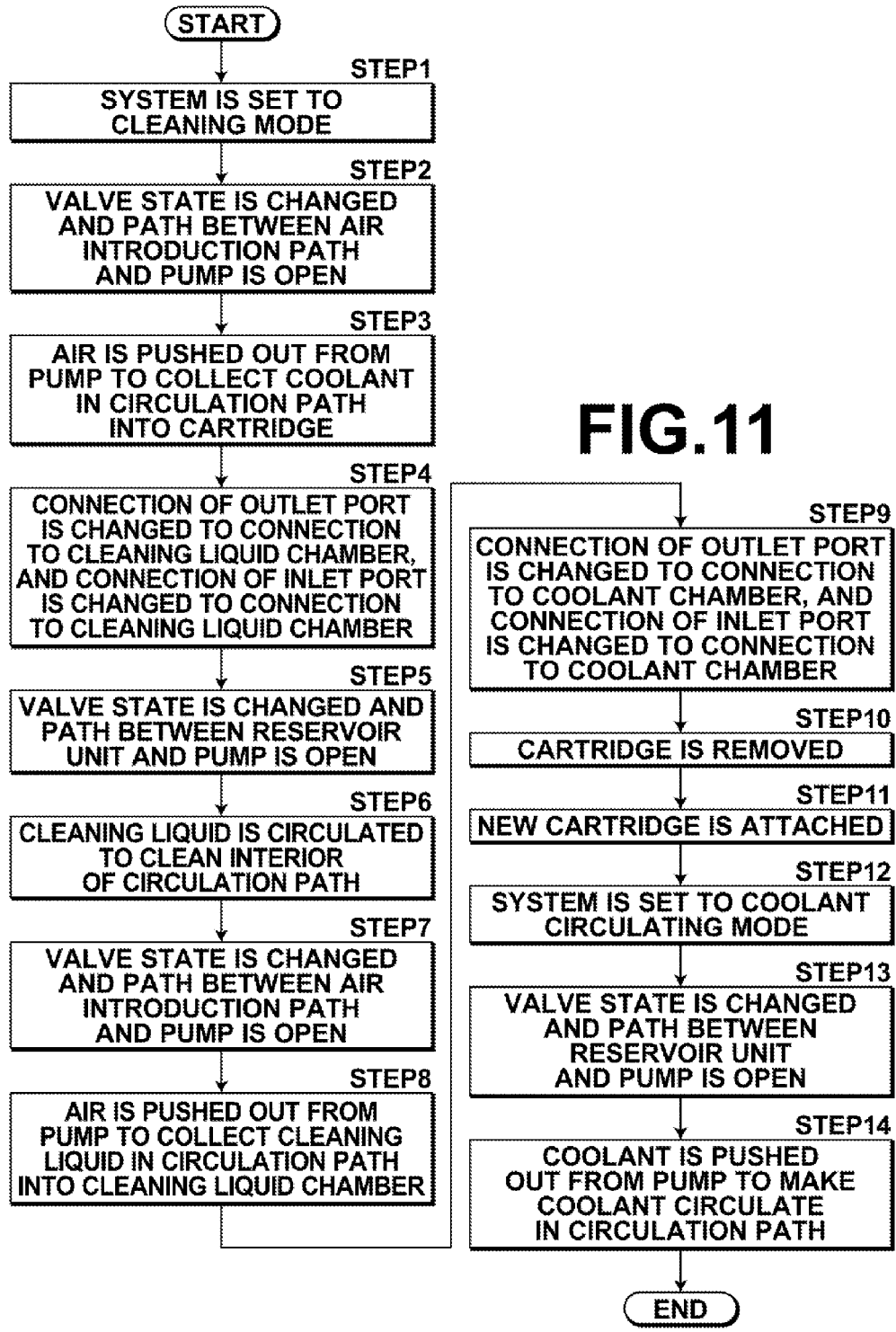
FIG. 11 is a flow chart showing steps of a coolant replacement work of the second embodiment.

Now, the procedure of the coolant replacement work of this embodiment is described using FIG. 11. FIG. 11 is a flow chart showing the steps of the coolant replacement work of this embodiment.

In this embodiment, first, the circulation path is cleaned using the cleaning liquid remaining in the cartridge 45, before the coolant is replaced. This is to prevent the coolant from being contaminated by contaminants in the circulation path immediately after the coolant is replaced. To this end, the operator sets the mode of the cooling system to the cleaning mode via the mode change input unit 9 (STEP 1). At this time, the control unit 8 changes the valve state of the valve 5 from the second open state to the first open state (STEP 2). Thus, the path between the gas introduction path 12 and the pump 6 is open, and gas is introduced into the circulation path 10 from the gas introduction path 12 to push the coolant into the coolant chamber 50 of the cartridge 45, thereby collecting the coolant 40 into the cartridge 45 (STEP 3). Thereafter, the connection mode of the connection port is changed from connection to the coolant chamber 50 to connection to the cleaning liquid chamber 51 (STEP 4). Then, the control unit 8 changes the valve state of the valve 5 from the first open state to the second open state (STEP 5). Thus, the path between the reservoir unit 4 and the pump 6 is open, and the cleaning liquid is fed from the cartridge 45 into the circulation path outside and circulates as the circulating liquid in the circulation path 10 to clean the interior of the circulation path 10 (STEP 6). When the cleaning is finished, the control unit 8 changes the valve state of the valve 5 from the second open state to the first open state (STEP 7). Thus, the path between the gas introduction path 12 and the pump 6 is open, and gas is introduced into the circulation path 10 from the gas introduction path 12 to push the cleaning liquid out into the cleaning liquid chamber 51, thereby collecting the cleaning liquid into the cartridge 45 (STEP 8). It should be noted that, when all the cleaning liquid has been collected, the circulation path outside is filled with gas.

Then, the connection mode of the connection port is changed from connection to the cleaning liquid chamber 51 to connection to the coolant chamber 50 (STEP 9). Thereafter, the current cartridge 45 is removed (STEP 10), and a new cartridge 45 containing fresh coolant and fresh cleaning liquid is attached to the cartridge loading unit (STEP 11). After the cartridge 45 is properly attached to the cartridge loading unit, the mode of the cooling system is manually or automatically changed to the coolant circulating mode (STEP 12). At this time, the control unit 8 changes the valve state of the valve 5 from the first open state to the second open state (STEP 13). Thus, the path between the reservoir unit 4 and the pump 6 is open, and the coolant is fed from the cartridge 45 into the circulation path outside and begins to circulate as the circulating liquid in the circulation path 10 (STEP 14). Then, when the circulation path 10 is filled with the coolant, the coolant replacement work ends.

The above-described procedure allows the next coolant replacement work to also begin with cleaning of the circulation path using the cleaning liquid remaining in the cartridge 45. It should be noted that the timing of cleaning is not necessarily be immediately before the coolant is replaced. For example, the cleaning of the circulation path may be performed regularly with a period that is shorter than the period of replacement of the coolant independently from the replacement of the coolant. For example, in this case, after the cleaning liquid is collected in STEP 8 shown in FIG. 11, the cartridge is not removed and the process proceeds to STEP 12 where the coolant circulating mode is set.

As described above, according to the cooling system, the reservoir unit and the cartridge of this embodiment, as well as the solid-state laser oscillator system provided with them, the same effects as those obtained in the first embodiment can be obtained.

Further, in this embodiment, the cartridge contains the cleaning liquid in addition to the coolant, and this facilitates removing contamination in the circulation path.

Third Embodiment

Next, a third embodiment of the cooling system, the reservoir unit and the cartridge, as well as the solid-state laser oscillator system provided with them is described. The difference between this embodiment and the first embodiment lies in that the cooling system of this embodiment includes a first monitoring unit for monitoring the optical pumping intensity of the pumping lamp 14, and a second monitoring unit for monitoring the output intensity of the laser light L2 outputted from the oscillator 2. Therefore the same features as those of the first embodiment are not described in detail unless otherwise necessary. It should be noted that the similar elements are denoted by the same reference numerals as long as there is no inconvenience.

Figure 12:
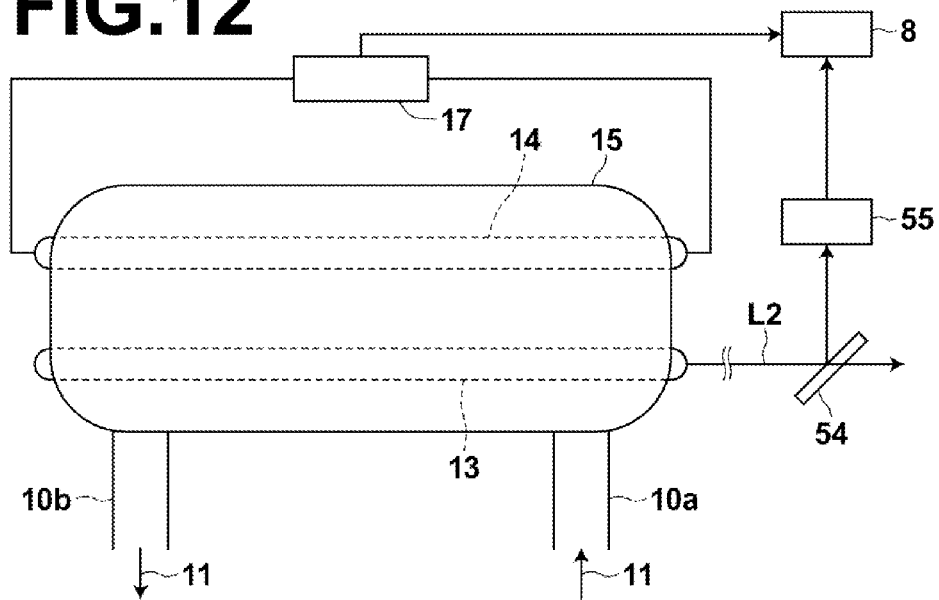
FIG. 12 is a schematic view showing an area around a laser chamber (heat absorbing section) and the configuration of a second monitoring unit of a third embodiment.

FIG. 12 is a schematic view showing an area around the laser chamber 15 of this embodiment and the configuration of the second monitoring unit.

As shown in FIG. 12, the solid-state laser oscillator system 1 of this embodiment includes a voltage monitoring circuit 17 as the first monitoring unit, and a beam splitter 54 and an optical sensor 55 as the second monitoring unit.

The voltage monitoring circuit 17 measures a voltage applied to the pumping lamp 14. Then, the voltage monitoring circuit 17 generates an intensity signal according to an intensity of the measured voltage, and outputs the signal to the control unit 8.

The beam splitter 54 splits and takes out a part (for example, 1%) of the laser light L2 as light used for the monitoring (monitoring light).

The optical sensor 55 detects the monitoring light. Then, the optical sensor 55 generates an intensity signal according to an intensity of the detected monitoring light, and outputs the signal to the control unit 8. It should be noted that the position of the optical sensor 55 is not limited to a position where the optical sensor 55 detects a part of the laser light L2 actually outputted from the oscillator 2, as in this embodiment. For example, in a case where the mirror 18 is replaced with one that transmits part of the light, the optical sensor 55 may be located at a position within the oscillator 2 where the optical sensor 55 detects the light transmitted through the mirror 18.

The control unit 8 assumes that the intensity of the signal outputted from the voltage monitoring circuit 17 represents the optical pumping intensity of the pumping lamp, and that the intensity of the signal outputted from the optical sensor 55 represents the output intensity of the laser light L2. Then, based on the optical pumping intensity and the output intensity, the control unit 8 determines whether or not the circulating liquid circulating in the circulation path is contaminated. In this embodiment, the control unit 8 also functions as a determination unit of the invention. For example, in the case where the circulating liquid is contaminated, light emitted from the pumping lamp 14 is significantly attenuated when it reaches the laser rod 13. Therefore in the case where the circulating liquid is contaminated, the ratio of the output intensity to the optical pumping intensity is smaller than that in the case where the circulating liquid is not contaminated. Then, the control unit 8 can determine whether or not the circulating liquid is contaminated based, for example, on the ratio of the output intensity to the optical pumping intensity. If it is determined that the circulating liquid is contaminated, the control unit 8 controls the solid-state laser oscillator system 1 to issue a warning, such as a display to that effect on a display unit, for example.

As described above, according to the cooling system, the reservoir unit and the cartridge of this embodiment, as well as the solid-state laser oscillator system provided with them, the same effects as those obtained in the first embodiment can be obtained.

Further, in this embodiment where the monitoring system for determining whether or not the circulating liquid is contaminated is provided, it is easy to know if it is time to replace the circulating liquid.

INDUSTRIAL APPLICABILITY

While the cooling system of the invention is applied to the solid-state laser oscillator system in the above-described embodiment, this is not intended to limit the invention. For example, in a case where the invention is combined with a heat sink, the invention can be used as a cooling system of other laser devices, such as semiconductor lasers, a cooling system of information processing units, such as severs, etc.

Figure 13:
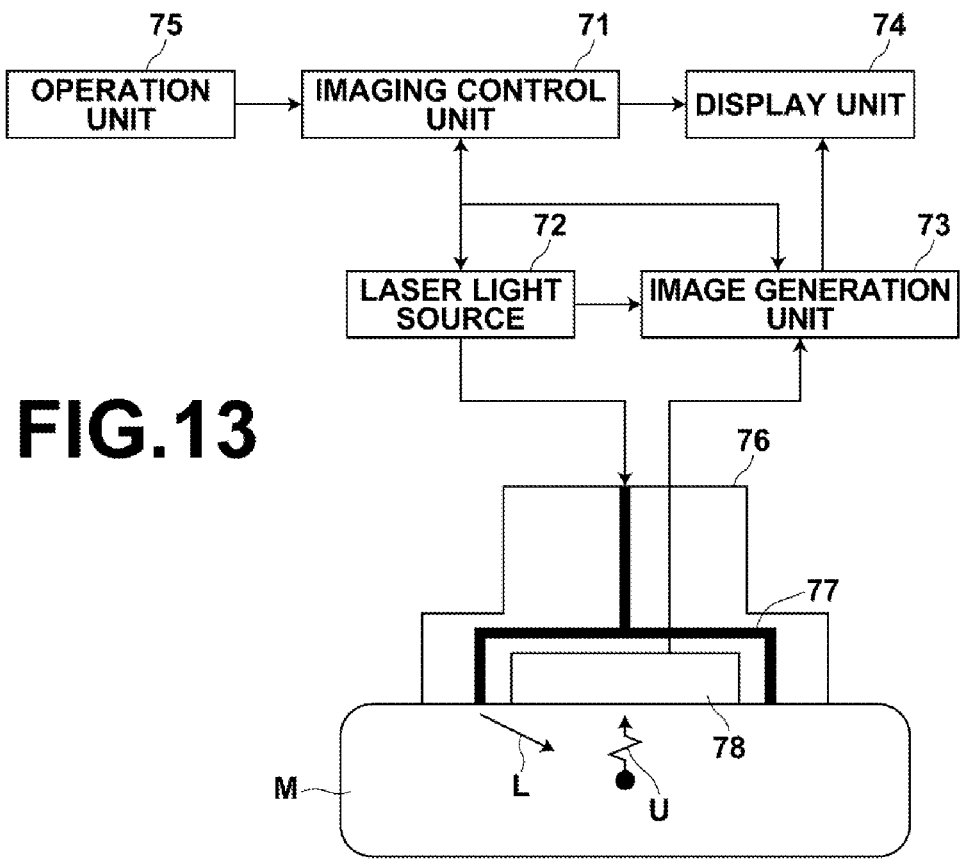
FIG. 13 is a schematic view showing an example of use of the solid-state laser oscillator system.
Figure 14:
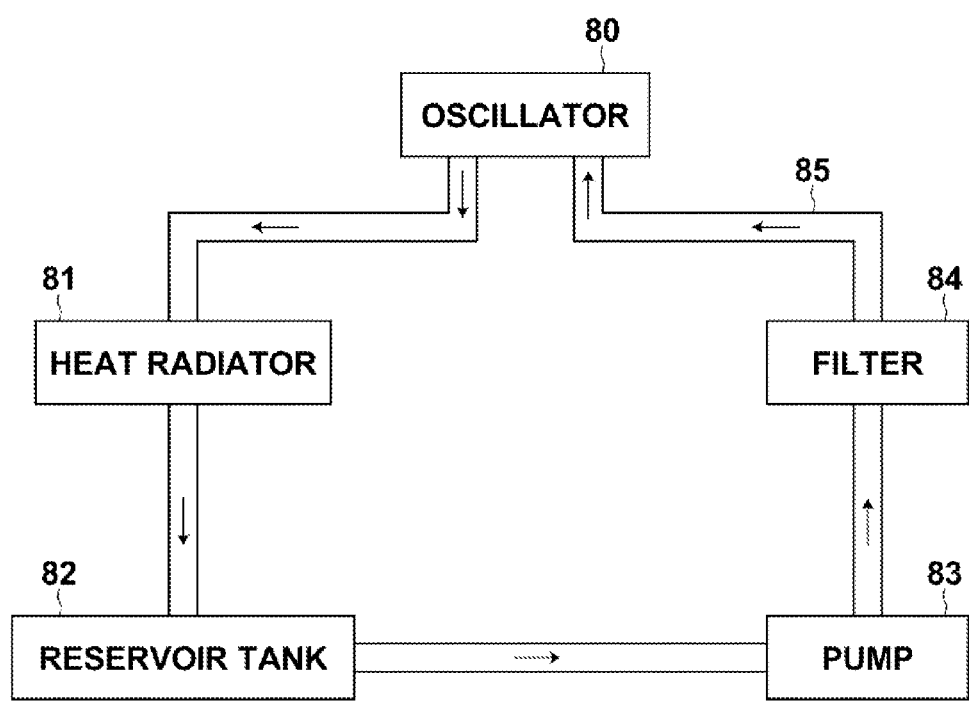
FIG. 14 is a schematic block diagram illustrating the configuration of a conventional cooling system.

Further, the solid-state laser oscillator system of the invention can be used with a photoacoustic image generation device, as shown in FIG. 13, for example. The photoacoustic image generation device 70 shown in FIG. 13 includes an imaging control unit 71, a laser light source 72 including the solid-state laser oscillator system of the invention, an image generation unit 73, a display unit 74, an operation unit 75 (a user interface), and a probe 76.

The imaging control unit 71 controls the laser light source 72, the image generation unit 73, the display unit 74 and the operation unit 75. For example, the imaging control unit 71 outputs a trigger signal for synchronization among these units.

The laser light source 72 outputs, as measurement light, laser light L to be applied to a subject body part M. The laser light source 72 includes at least one light source that emits laser light having a wavelength included in an absorption peak of blood, for example.

The wavelength of the laser light L is determined as appropriate depending on light absorption characteristics of substances in the subject M to be imaged. For example, in a case where the object to be imaged is hemoglobin in a living body (that is, where blood vessels in the living body is imaged), it is preferred that the wavelength of the laser light L is around 600 to 1000 nm, which provides good light transmittance through a living body and corresponds to the light absorption peak of various hemoglobin species.

The image generation unit 73 generates a photoacoustic image based on acoustic signals detected with the probe 76. For example, image data corresponding to one frame is constructed by converting each position along the time axis of data of the acoustic signals corresponding to one line into a position along the displacement axis which represents the depth of a slice image. Further, if desired, the image data corresponding to one frame may be superimposed and arranged on virtual spatial coordinates based on image data corresponding to one frame generated for each scanning position of the probe 76, or volume data for three-dimensional photoacoustic image may be constructed with interpolating obtained data.

The display unit 74 displays a photoacoustic image based on the image data generated by the image generation unit 73.

The operation unit 75 is used to input necessary information by the user. For example, the user may specify the direction of view point of a displayed photoacoustic image, input patient information or information of imaging conditions, etc., via the operation unit 75.

The probe 76 is formed by a light application section 77 and a transducer array 78, and applies the laser light L to the subject body part M and detects photoacoustic waves U from the subject body part M.

What is claimed is:

1. A cooling system for cooling a heat source, the system comprising a circulation path in which a circulating liquid circulates, wherein the circulation path comprises, as elements along the path, a reservoir unit that stores the circulating liquid, a pump for feeding the circulating liquid in the circulation path, a heat absorbing section where heat generated from the heat source is absorbed by a coolant which is the circulating liquid, and a heat release section where the coolant releases heat, the reservoir unit comprises a cartridge and a cartridge loading unit configured to be removable from each other, the cartridge comprises a reservoir chamber that stores the circulating liquid, and a connection portion that includes a first communication port in fluid communication with the reservoir chamber, the cartridge loading unit comprises a connection receiving portion and a connection port, wherein the connection portion is connected to the connection receiving portion, the connection receiving portion comprises a second communication port that communicates with the first communication port when the connection portion is connected to the connection receiving portion, and the connection port provides fluid communication between the second communication port and the circulation path outside, and, when the cartridge and the cartridge loading unit are attached to each other, the connection portion, the connection receiving portion and the connection port form a feed path that allows feeding the circulating liquid in the reservoir chamber into the circulation path outside, and a collection path that allows collecting the circulating liquid from the circulation path outside into the reservoir chamber.

2. The cooling system as claimed in claim 1, wherein the circulation path comprises a branched valve between the reservoir unit and the pump, one of branches of the valve is connected to a gas introduction path and other two branches of the valve are connected to the circulation path, and the valve comprises valves that are openable and closable such that a path between the gas introduction path and the pump is open when the circulating liquid is collected into the reservoir chamber, or a path between the reservoir unit and the pump is open when the circulating liquid is fed from the reservoir chamber.

3. The cooling system as claimed in claim 2, wherein air is introduced as gas through the gas introduction path.

4. The cooling system as claimed in claim 1, wherein the reservoir chamber comprises a plurality of partitioned reservoir chambers separated from each other, the connection portion comprises a plurality of connection portions provided at the cartridge correspondingly to the individual partitioned reservoir chambers, the connection receiving portion comprises a plurality of connection receiving portions provided at the cartridge loading unit correspondingly to the individual connection portions, and the connection port is connectable to each of the second communication ports of the connection receiving portions in a switchable manner.

5. The cooling system as claimed in claim 4, wherein one of the partitioned reservoir chambers stores a coolant as one type of the circulating liquid, and another one of the partitioned reservoir chambers stores a cleaning liquid as another type of the circulating liquid.

6. The cooling system as claimed in claim 1, wherein at least a part of the cartridge is made of a transparent material to allow checking a level of contamination of the circulating liquid in the cartridge.

7. The cooling system as claimed in claim 1, wherein the reservoir unit comprises a sensor that detects whether or not the cartridge is properly attached to the cartridge loading unit, and the cooling system comprises a control unit that removes a cause of heat generation from the heat source when proper attachment between the cartridge and the cartridge loading unit is not detected by the sensor.

8. A reservoir unit used as an element along a circulation path in which a circulating liquid circulates, the reservoir unit comprising a cartridge and a cartridge loading unit configured to be removable from each other, wherein the cartridge comprises a reservoir chamber that stores the circulating liquid, and a connection portion that includes a first communication port in fluid communication with the reservoir chamber, the cartridge loading unit comprises a connection receiving portion and a connection port, wherein the connection portion is connected to the connection receiving portion, the connection receiving portion comprises a second communication port that communicates with the first communication port when the connection portion is connected to the connection receiving portion, and the connection port provides fluid communication between the second communication port and the circulation path outside, and, when the cartridge and the cartridge loading unit are attached to each other, the connection portion, the connection receiving portion and the connection port form a feed path that allows feeding the circulating liquid in the reservoir chamber into the circulation path outside, and a collection path that allows collecting the circulating liquid from the circulation path outside into the reservoir chamber.

9. The reservoir unit as claimed in claim 8, wherein the reservoir chamber comprises a plurality of partitioned reservoir chambers separated from each other, the connection portion comprises a plurality of connection portions provided at the cartridge correspondingly to the individual partitioned reservoir chambers, the connection receiving portion comprises a plurality of connection receiving portions provided at the cartridge loading unit correspondingly to the individual connection portions, and the connection port is connectable to each of the second communication ports of the connection receiving portions in a switchable manner.

10. The reservoir unit as claimed in claim 9, wherein the reservoir unit is used in a cooling system for cooling a heat source, one of the partitioned reservoir chambers stores a coolant as one type of the circulating liquid, and another one of the partitioned reservoir chambers stores a cleaning liquid as another type of the circulating liquid.

11. The reservoir unit as claimed in claim 8, wherein at least a part of the cartridge is made of a transparent material to allow checking a level of contamination of the circulating liquid in the cartridge.

12. The reservoir unit as claimed in claim 8, further comprising a sensor that detects whether or not the cartridge is properly attached to the cartridge loading unit.

13. A cartridge forming a reservoir unit used as an element along a circulation path in which a circulating liquid circulates, the cartridge being attachable to and removable from a cartridge loading unit, wherein the cartridge loading unit comprises a connection receiving portion and a connection port, the connection receiving portion comprises a second communication port in fluid communication with a first communication port of the cartridge, and the connection port provides fluid communication between the second communication port and the circulation path outside, the cartridge comprising a reservoir chamber that stores the circulating liquid, and a connection portion that includes the first communication port in fluid communication with the reservoir chamber, wherein, when the cartridge and the cartridge loading unit are attached to each other, the connection portion, the connection receiving portion and the connection port cooperate to form a feed path that allows feeding the circulating liquid in the reservoir chamber into the circulation path outside, and a collection path that allows collecting the circulating liquid from the circulation path outside into the reservoir chamber.

14. The cartridge as claimed in claim 13, wherein the reservoir chamber comprises a plurality of partitioned reservoir chambers separated from each other, and the connection portion comprises a plurality of connection portions provided at the cartridge correspondingly to the individual partitioned reservoir chambers.

15. The cartridge as claimed in claim 14, wherein the cartridge is used in a cooling system for cooling a heat source, one of the partitioned reservoir chambers stores a coolant as one type of the circulating liquid, and another one of the partitioned reservoir chambers stores a cleaning liquid as another type of the circulating liquid.

16. The cartridge as claimed in claim 13, wherein at least a part of the cartridge is made of a transparent material to allow checking a level of contamination of the circulating liquid in the cartridge.

17. The cartridge as claimed in claim 13, further comprising a filter for filtering out contamination from a coolant, the filter being disposed in the reservoir chamber.

18. The cartridge as claimed in claim 17, wherein the filter comprises a hollow fiber membrane filter.

19. A solid-state laser oscillator system comprising:

the cooling system as claimed in claim 1;

a laser rod;

a pumping lamp for optically pumping the laser rod; and a laser chamber that contains the laser rod and the pumping lamp, wherein the laser chamber forms a part of the circulation path and serves as a heat absorbing section of the cooling system.

* * * * *